United States Patent
Van Kessel (10) Patent No.: US 11,218,087 B2
(45) Date of Patent: Jan. 4, 2022

(54) SWITCH ASSISTED DIODE-CLAMPED ENERGY HARVESTING SYSTEM FOR VARIABLE CAPACITANCE TRANSDUCERS

(71) Applicant: SINGLE BUOY MOORINGS INC., Marly (CH)

(72) Inventor: Rick Van Kessel, Monaco (MC)

(73) Assignee: SINGLE BUOY MOORINGS INC., Marly (CH)

( * ) Notice: Subject to any disclaimer, the term of this patent is extended or adjusted under 35 U.S.C. 154(b) by 15 days.

(21) Appl. No.: 16/956,416

(22) PCT Filed: Dec. 19, 2018

(86) PCT No.: PCT/EP2018/085750
§ 371 (c)(1),
(2) Date: Jun. 19, 2020

(87) PCT Pub. No.: WO2019/121860
PCT Pub. Date: Jun. 27, 2019

(65) Prior Publication Data
US 2021/0104960 A1 Apr. 8, 2021

(30) Foreign Application Priority Data

Dec. 19, 2017 (EP) .................................... 17208623

(51) Int. Cl.
*H02N 1/00* (2006.01)
*G01R 19/00* (2006.01)

(52) U.S. Cl.
CPC .......... *H02N 1/00* (2013.01); *G01R 19/0046* (2013.01)

(58) Field of Classification Search
None
See application file for complete search history.

(56) References Cited

U.S. PATENT DOCUMENTS

| 6,580,177 B1 | 6/2003 | Hagood, IV et al. |
| 9,279,409 B2 | 3/2016 | Jean et al. |

(Continued)

FOREIGN PATENT DOCUMENTS

| DE | 10 2012 208557 A1 | 11/2013 |
| WO | 2010/146457 A2 | 12/2010 |

OTHER PUBLICATIONS

Van Kessel et al., "Analyses and comparison of an energy harvesting system for dielectric elastomer generators using a passive harvesting concept: the voltage-clamped multi-phase system", SS/NDE 2015—Electroactive Polymer Actuators and Devices (EAPAD) XVII, Proc, of SPIE, Conference Proceedings, 2015, vol. 9430, pp. 943006-1 to 943006-14, XP060051958.

(Continued)

*Primary Examiner* — Lincoln D Donovan
*Assistant Examiner* — Khareem E Almo
(74) *Attorney, Agent, or Firm* — Nixon & Vanderhye (57) ABSTRACT

An electrical energy harvesting system includes at least one variable capacitor, preferably of electro-active polymer, two voltage sources, and a half-bridge network. The voltage sources are arranged in series with an interconnecting node between a first polarity terminal of the first voltage source and a second opposite polarity terminal of the second voltage source. For each variable capacitor the half-bridge network includes a pair of diodes in series with a common node therebetween, connected in parallel with the first voltage source, an inductor connected between the common node and a first terminal of the variable capacitor, a first switch in parallel with the first diode, and a second switch in parallel with the second diode. The second terminal of the variable capacitor is connected to the first polarity terminal of the second voltage source.

20 Claims, 8 Drawing Sheets

(56) References Cited

U.S. PATENT DOCUMENTS

| | | | |
|---|---|---|---|
| 10,778,120 B2* | 9/2020 | Niu | H02J 7/00 |
| 11,096,429 B2* | 8/2021 | Riehl | H01F 38/14 |
| 2018/0375443 A1* | 12/2018 | Arulandu | H02N 2/181 |

OTHER PUBLICATIONS

International Search Report and Written Opinion, dated Mar. 29, 2019, from corresponding PCT application No. PCT/EP2018/085750.

* cited by examiner

SWITCH ASSISTED DIODE-CLAMPED ENERGY HARVESTING SYSTEM FOR VARIABLE CAPACITANCE TRANSDUCERS

FIELD OF THE INVENTION

The present invention relates to an energy harvesting system for harvesting electrical energy from at least one variable capacitor. Moreover, the invention relates to a method for harvesting electrical energy from at least one variable capacitor using such an energy harvesting system.

PRIOR ART

WO 2010/146457 discloses an environmental electrical generator having variable capacitors that each includes a repeatedly stretched and relaxed sheet of stretchable material and electrodes lying against opposite faces of the sheet, which includes a power extraction unit coupled to the electrodes of at least a pair of capacitors. The unit directs an electrical charge (current) from a first pair of electrodes that have a higher voltage, to one or more second pairs of electrodes that have a lower voltage, to recharge the second pairs of electrodes. During the current flow, electrical power is extracted by the drop-in voltage of current passing through the unit. The power extraction unit can be provided with a control unit that has voltage detectors and that selectively connect capacitors, based on their voltages, for maximum efficiency in generating power output. According to the prior art, a variable capacitor connects to a half-bridge consisting of a pair of anti-parallel diodes, which creates a passive harvesting system in which the charging and discharging cycle follows the change of the capacitance of the variable capacitor e.g., as induced by a changing external force acting on the variable capacitor. A description of this energy harvesting system has been published in: R. van Kessel, A. Wattez, and P. Bauer, "Analyses and comparison of an energy harvesting system for dielectric elastomer generators using a passive harvesting concept: the voltage-clamped multi-phase system," in SS/NDE 2015—Electroactive Polymer Actuators and Devices (EAPAD) XVII, ser. Proc. SPIE, vol. 9430, 2015, Conference Proceedings.

The energy harvesting system of the prior art has a relatively low energy capture ability, especially for small capacitance variation levels. As a result it has a low efficiency at particularly small capacitance variation levels due to dielectric losses which are roughly constant and independent of the capacitance variation.

It is an object of the invention to overcome or mitigate the disadvantage from the prior art.

SUMMARY OF THE INVENTION

The object is achieved by the energy harvesting system as defined in claim 1.

By incorporating for each variable capacitor an inductor, a first switch and a second switch in which the inductor is connected between the common node and the first capacitor terminal of the respective variable capacitor, and in which the first switch is connected in parallel with the first diode and the second switch is connected in parallel with the second diode, an additional step-up and step-down converter is implemented. In addition, in the energy harvesting system according to the invention, the second voltage source provides a bias source to the source side such that the active components are exposed to lower voltages for the same variable capacitor voltage. As a result, less energy conversion is required which results in relatively lower losses, in comparison with the energy harvesting system of the prior art.

In addition, the invention relates to a method for operating the energy harvesting system as defined in claim 13.

The method provides an active switching mode comprising setting the second switch in an modulated conductive state during a portion of the discharging time interval while the first switch remains in the non-conductive state, and setting the first switch in an modulated conductive state during a portion of the charging time interval, while the second switch remains in the non-conductive state.

During the active charging or discharging intervals, in the modulated conductive state the respective switch is continuously switched on and off at a rate of typically several kHz, whereby also the complementary switch/diode pair provides a current path (free-wheeling diode).

According to the prior art the charging and discharging cycle of the variable capacitor follows the stretching and relaxing of the variable capacitor as imposed by an external mechanical force acting on the gap between the electrodes of the variable capacitor.

According to the method of the invention, the charging of the variable capacitor is extended upto a comparatively larger charge than possible by passively charging of the variable capacitor. Also, the discharging of the variable capacitor is extended to a comparatively smaller resulting charge than in the prior art. As a result, the effectiveness of the charging and discharging cycle is improved.

Advantageous embodiments are further defined by the dependent claims.

BRIEF DESCRIPTION OF DRAWINGS

The invention will be explained in more detail below with reference to drawings in which illustrative embodiments thereof are shown. The drawings are intended exclusively for illustrative purposes and not as a restriction of the inventive concept. The scope of the invention is only limited by the definitions presented in the appended claims.

In each of the figures, similar or corresponding elements will be indicated by the same reference.

DETAILED DESCRIPTION OF EMBODIMENTS

Figure 1:
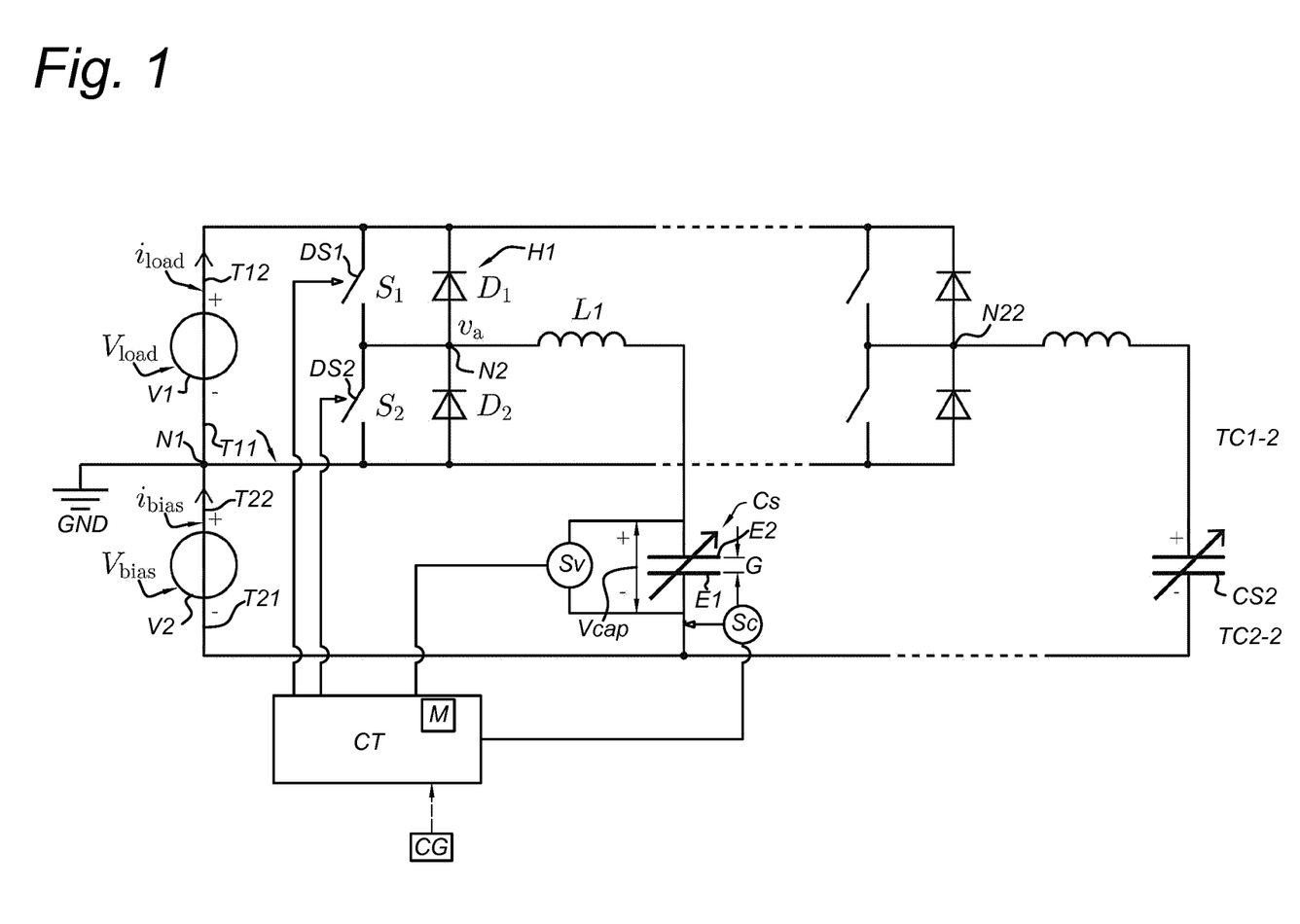
FIG. 1 shows schematically a circuitry of an energy harvesting system according to an embodiment of the invention.

FIG. 1 shows schematically a circuitry of an energy harvesting system according to an embodiment of the invention.

An energy harvesting system 100 according to an embodiment of the invention is configured for harvesting energy from one or more variable capacitors Cs. Such variable capacitors Cs can be based on electro-active polymer devices. Electro-active polymer devices function as electrostatic energy transducers that convert mechanical energy into electrical energy. Such transducers consist of at least one pair of electrodes that are positioned opposite each other and are separated by a gap that comprises a deformable dielectric, constituting a variable capacitor whose capacitance varies with the level of imposed deformation.

Operating such an electrostatic energy transducer to harvest mechanical energy is achieved by cyclically applying electric charges on the capacitor structure at a state of maximum deformation and subsequently removing the charges at a state of minimum deformation. While moving from a state of maximum deformation to a state of minimum deformation, the thickness of the deformable dielectric and thus the gap between the electrodes increases whereby the charges of opposite polarity are increasingly separated. The resulting increase in potential energy is captured by an electrical circuit.

The energy harvesting system 100 comprises at least one variable capacitor Cs, a first voltage source V1 for providing a first voltage $V_{load}$ and a second voltage source V2 for providing a second voltage $V_{bias}$. The gap between the electrodes E1, E2 of the variable capacitor Cs is indicated by reference G.

The energy harvesting system further comprises per variable capacitor Cs a half-bridge network H1 consisting of a diode pair consisting of a first diode D1 and a second diode D2 that are connected in series with a common node N2 between the first and second diodes D1, D2. Each diode D1;D2 is arranged with an associated switch S1;S2 that is connected in parallel with the respective diode.

In the energy harvesting system the first and second voltage sources V1, V2 are arranged in a series connection with an interconnecting node N1 between a first terminal T11 of the first voltage source V1 and a first terminal T22 of the second voltage source V2. The first terminal T22 of the second voltage source V2 has a second polarity that is opposite to the polarity of the first terminal T11 of the first voltage source.

The diode pair D1, D2 is connected in parallel to the first voltage source between the terminal T11 of the first voltage source V1 and a second terminal T12 of the first voltage source V1.

In the energy harvesting system the voltage between the electrodes E1 and E2 is either $V_{bias}$ from V2 or $V_{load}+V_{bias}$ from V1+V2 or a voltage in between $V_{bias}$ and $V_{load}+V_{bias}$.

The variable capacitor Cs is connected with a first capacitor terminal TC1 to the common node N2 and with a second capacitor terminal TC2 to a second terminal T21 of first polarity of the second voltage source V2. The second terminal T21 has a polarity with a same sign as the first terminal T11 of the first voltage source V1.

The system further comprises per variable capacitor an inductor L1, a first switch S1 and a second switch S2.

The inductor L1 is connected between the common node N2 and the first capacitor terminal TC1 of the respective variable capacitor.

The first switch S1 is connected in parallel with the first diode D1 between terminal T12 of the first voltage source V1 and the common node N2. The second switch S2 is connected in parallel with the second diode D2, between the interconnecting node N1 and the common node N2.

In their conductive state, each of the first and second switches is arranged to be actively switched on and off at a high switching rate, with a frequency several orders of magnitude higher than a fundamental frequency of deformation of the variable capacitor, typically above 1 kHz. (In the following description, actively switching is also referred to as a modulated conductive state of the respective switch S1;S2 and the complementary diode D2;D1).

During an active charging interval, the first switch S1 is held alternately in the conductive and non-conductive state. For a first duration t_on1, switch S1 is held in the conductive state during which the magnitude of the current through inductor L1 increases progressively. After t_on1, switch S1 is held in the non-conductive state for a second duration t_off1. During the second duration, the current is forced through the second diode D2 by the reverse voltage induced across the inductor L1. As a result the magnitude of the current through inductor L1 decreases progressively.

In steady-state during active charging, the current in consequence fluctuates around the average charging current. The magnitude of the fluctuation depends on voltage V1, voltage ($v_{cap}|V_{bias}$), the inductance of inductor L1, and durations t_on1 and t_off1. It is identified that smaller fluctuations result in lower conduction losses.

In non-steady-state, e.g. for ramping up or down the average charging current, durations t_on1 and t_off1 are selected such that the increase in current during t_on1 is either larger or respectively smaller than the decrease during t_off1.

During an active discharging interval, the second switch S2 is held alternately in the conductive and non-conductive state. For a third duration t_on2, the second switch S2 is held in the conductive state during which the magnitude of the current through inductor L1 increases progressively and with opposite polarity compared to the charging interval. After third duration t_on2 is ended, the second switch S2 is held in the non-conductive state for a fourth duration of t_off2. During this fourth duration interval the current is forced through the first diode D1 by the reverse voltage induced across the inductor L1. As a result the magnitude of the current through inductor L1 decreases progressively.

In steady-state during active discharging, the current in consequence fluctuates around the average discharging current. The magnitude of the fluctuation depends on voltage V1, voltage ($v_{cap}-V_{bias}$), the inductance of inductor L1, and third and fourth durations t_on2 and t_off2. It is identified that smaller fluctuations result in lower conduction losses.

In non-steady-state, e.g. for ramping up or down the average discharging current, third and fourth durations t_on2 and t_off2 are selected such that the increase in current during t_on2 is either larger or respectively smaller than the decrease during t_off2.

A switching modulator or driver element (not shown) generates the switching signals for switch S1 and S2. The switching signals implement the first, second, third and fourth durations t_on1, t_off1, t_on2, t_off2 and the respective corresponding switch state. The input of the switching modulator may be the output of a control-loop that enforces an electrical quantity of the variable capacitor to follow a reference signal. Such reference signal may be the voltage $v_{cap}$ across the variable capacitor, for which the reference signal is programmed to reflect the cycle described in the q,V diagram as described below in more detail.

Depending on the durations t_on1, t_off1, t_on2, t_off2, as well as voltage V1, voltage ($v_{cap}|V_{bias}$), and the inductance of inductor L1, the current through the variable capacitor may or may not reach zero at the end of the cyclic non-conductive state. The conductive state interval of the next switching cycle restarts essentially from the current at the end of the non-conductive state, which could either be zero or non-zero. The present invention may be operated in both modes, whereas it is identified that the non-zero returning current mode yields lower conduction losses.

In one embodiment of the present invention, the switching modulators of the variable capacitors share a common switching clock signal for synchronous operation. Each switching modulator would be assigned a relative phase, statically or dynamically, by which the fluctuating currents from the active charging and active discharging interval are interleaved. It is identified that such interleaved operation is beneficial for reducing the high-frequency current fluctuation on the bus side, which reduces the losses especially for relative high bus impedances, for instance when the distance between the voltage sources and variable capacitors and their half-bridges is relatively large.

In an embodiment, the first and second switches and associated driver elements are embodied by semiconductor device based switches such as IGBT devices.

The inductor L1 constitutes a switched-mode filter inductor for an active charge displacement mode, i.e., when one or more of the switches are in the modulated conductive state, whereas it has no significant role in the passive operating mode, when both switches S1 and S2 are set in the non-conductive state.

For both active and passive modes, the inductor L1 enhances the energy harvesting system's robustness by limiting the rise of the capacitive fault current in case of a (dielectric) breakdown of a connected variable capacitor. In this manner, the inductor L1 provides additional time for conventional circuit breakers and fuses or solid-state switches to interrupt the fault current and to prevent a system-wide shut-down.

Through the inductor, the variable capacitor Cs connects to the half-bridge network H1 consisting of the pair of controllable switches S1, S2 with the pair of anti-parallel diodes D1, D2.

In an embodiment, the switches and diodes are each discrete devices. Alternatively, the diodes D1, D2 may each be integrated into the respective switch S1, S2.

Optionally, additional diodes DS1, DS2 are added externally as discrete devices in addition to anti-parallel diodes D1, D2 integrated within the switches S1, S2. In this manner, an increased redundancy is obtained: when any of the switches has failed, and provided that such switch is disconnectable or fused, the variable capacitor would be able to continue to generate electrical energy in passive-only mode by means of the redundant discrete additional diodes.

Furthermore, it will be appreciated that in passive mode, the switches are kept off (or set to the non-conductive state) and by identifying that the rate of change of current is much lower than for the active mode, the voltage drop across the inductor L1 may be neglected. In active mode however, the half-bridge in combination with the inductor is actively controlled as step-down (Buck) and step-up (Boost) converter, for respectively charging (dq/dt>0) and discharging (dq/dt<0), q denoting charge and t denoting time. The input voltage of the converters is $v_{in}=V_{load}$, whereas the output voltage equals $v_{out}=v_{cap}-V_{bias}$. Given that the variable capacitor voltage $v_{cap}$ is always between $V_{low}$ and $V_{high}$, the output voltage of the converters is restricted between 0 and $V_{load}$. Note that $V_{low}=V_{bias}$, $V_{high}=V_{load}+V_{bias}$. Under those conditions, the inductor L1 has to be located at the output i.e. variable capacitor side of the converter. The result for the variable capacitor is a continuous current on the time-scale of the switching frequency. The continuous current has a lower RMS value, which is beneficial for the series resistance losses of the variable capacitor.

The energy harvesting system 100 further comprises a controller CT for each variable capacitor Cs that is configured to measure a voltage $v_{cap}$ over the respective variable capacitor Cs by a voltage sensor Sv and to measure a current $i_{cap}$ through the respective variable capacitor by a current sensor Sc. Further, the controller CT is coupled to the first and second switches S1, S2 and configured for at least controlling the switching of each of the first and second switches, i.e., either to non-conductive state "off" or to modulated conductive state, "on". Optionally, the controller CT is also arranged for detecting the respective modulated conductive state or the non-conductive state.

FIG. 2A-2D show schematically charging and discharging states of the circuitry of FIG. 1.

The current paths for the charging and discharging of the variable capacitor are illustrated in FIGS. 2A-2D. In passive operating mode, the switches remain off or set to the non-conductive state and current flows through the diodes when the charge over capacitance (q/C) ratio has reached either of the voltages $V_{low}$, $V_{high}$ during discharging or charging, respectively.

Figure 2A:
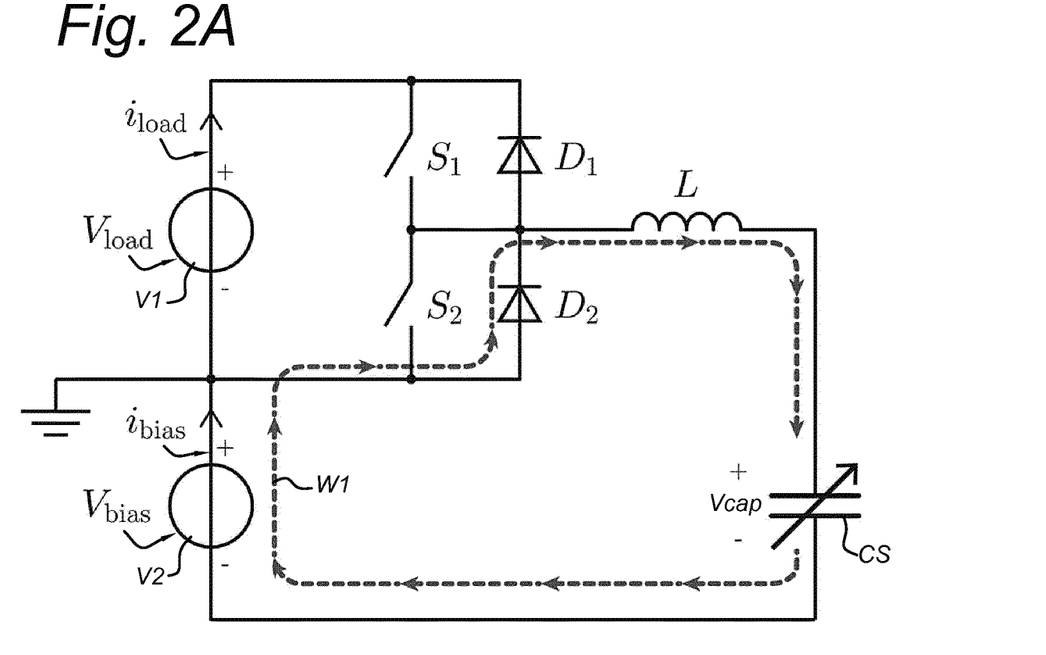
FIG. 2A-2D show schematically charging and discharging states of the circuitry of FIG. 1.
Figure 2B:
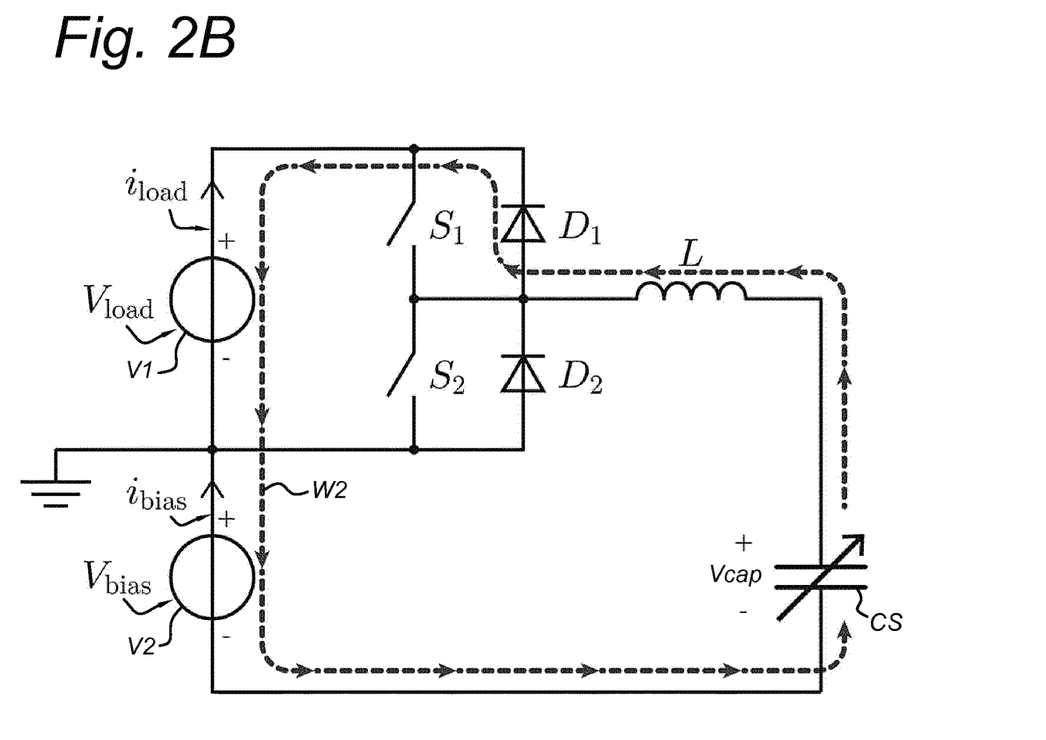

In FIG. 2A, a current path W1 for charging in passive mode is shown by a dashed line, where current flows through the second diode D2, while switches S1 and S2 are both open, i.e., non-conductive. In FIG. 2B, a current path W2 for discharging in passive mode is depicted. Here the current flows through the first diode D1, while both first and second switches S1, S2 are open.

Figure 2C:
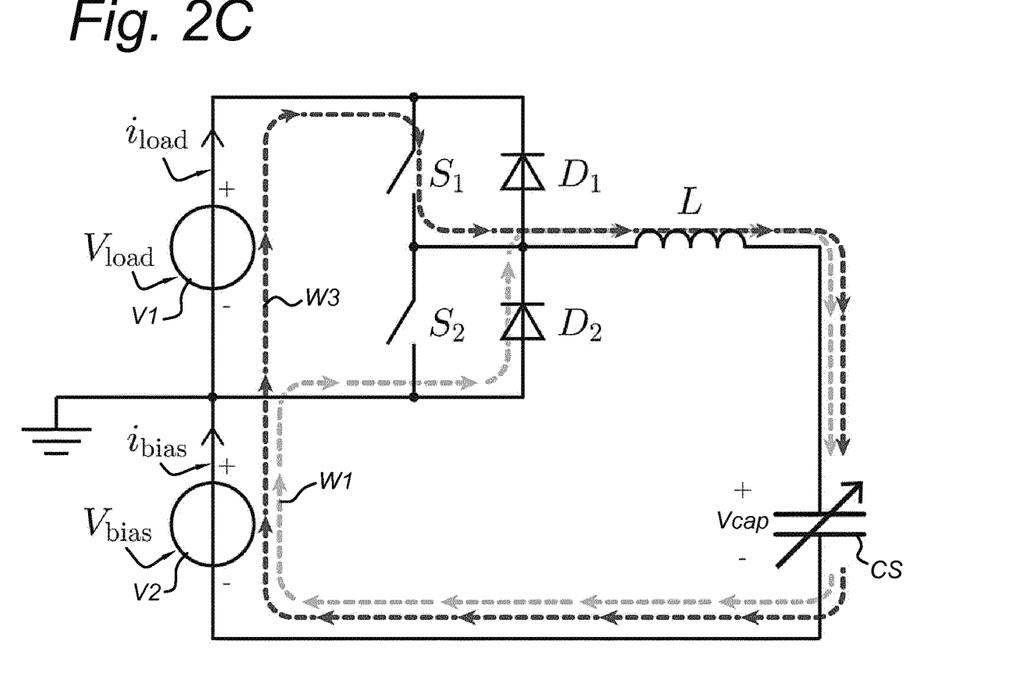

In FIG. 2C, a current path W3 for active charging is shown. In the active mode, the variable capacitor Cs is charged by the combination of first switch S1 in modulated conductive state and second (free-wheeling) diode D2 along current path W1 and W3. By the conductive state of the first switch S1, the first voltage source V1 is additionally coupled to the variable capacitor Cs for providing charge.

Figure 2D:
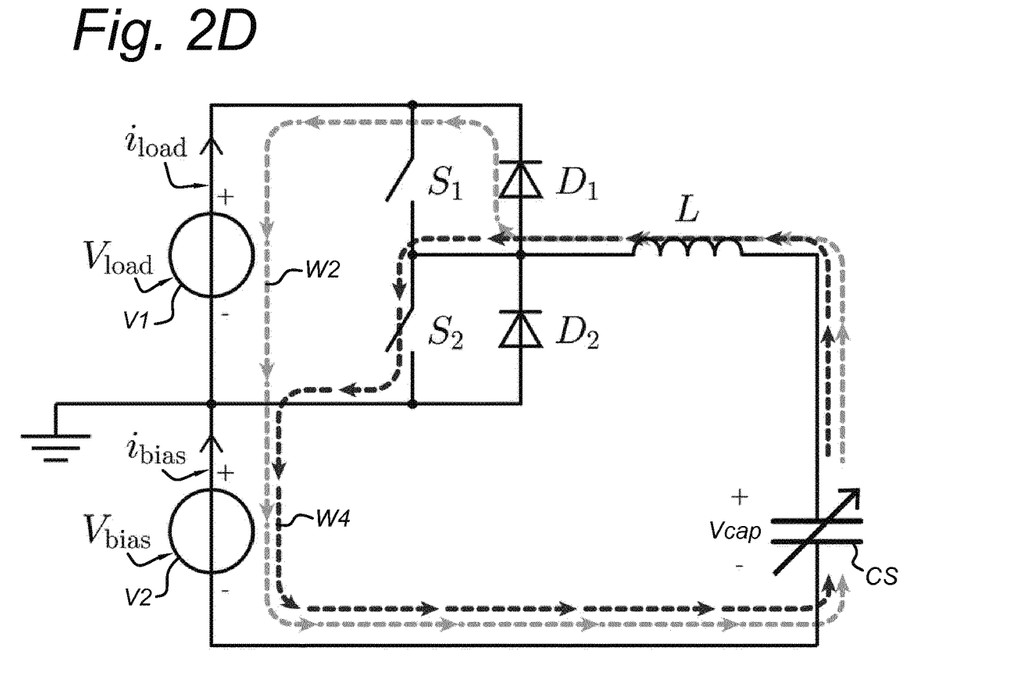

Discharging in the active mode takes place along a current path W4 as shown in FIG. 2D, where the second switch S2 is in modulated conductive state and the first switch S1 is in non-conductive state, which results in a current path W2 and W4 through both the first (free-wheeling) diode D1 and the second switch S2.

The skilled in the art will appreciate that charging is thus performed by a step-down converter similar circuitry and discharging by a step-up converter similar circuitry.

The control of the active mode of the proposed topology may consist of a low-level modulator implementing e.g. Pulse Width Modulation (PWM) along with closed-loop control on the output voltage.

In one embodiment of the present invention, synchronous rectification is applied in the active mode for intervals in which the (freewheeling) diode is conducting, and/or in the passive mode when the diode is clamping the variable capacitor to either $V_{low}$ or $V_{high}$. Turning on the channel of a potential unipolar semiconductor switch is identified to lower the switch conduction losses for low-current conditions such as during the harvesting cycle phase in which the electric field is kept essentially constant.

In one embodiment of the present invention, the controller is coupled to a clock signal generator CG and comprises modulating circuitry M in which modulators that are arranged in the controller CT are each coupled to an associated one of the switches S1, S2 of all variable capacitors to share a common switching clock signal for synchronous operation. Each modulator would be assigned a relative phase, statically or dynamically, by which the step-up and step-down converters of all variable capacitors are interleaving their currents. It is identified that such interleaved operation is beneficial for reducing the high-frequency current ripple on the bus side, i.e., on the side of first voltage source V1, which reduces the losses especially for relative high bus impedances, for instance when the distance between the voltage sources and variable capacitors and their half-bridges is relatively large. For example, the distance is above 1 meter and no busbar is used between . . . .

In an embodiment, a grounding connection GND is applied at the interconnecting node N1 between the two voltage sources V1, V2. The resulting topology has both voltage sources V1, V2 referenced to ground potential, as well as the half-bridges connected to ground potential. It is observed that advantageously, such a connection scheme reduces the complexity of the voltage source and half-bridge components and their support circuits.

In an alternative embodiment, the grounding connection GND is arranged at the level of the second terminal T21 of the second voltage source V2.

In an embodiment, the invention provides that the variable capacitor Cs and/or connecting cables thereof has/have an outer shield (not shown) that is connected to ground potential GND. Accordingly, the energy harvesting system has favorable characteristics in terms of insulation voltage rating, safety and electromagnetic interference (EMI).

Figure 3:
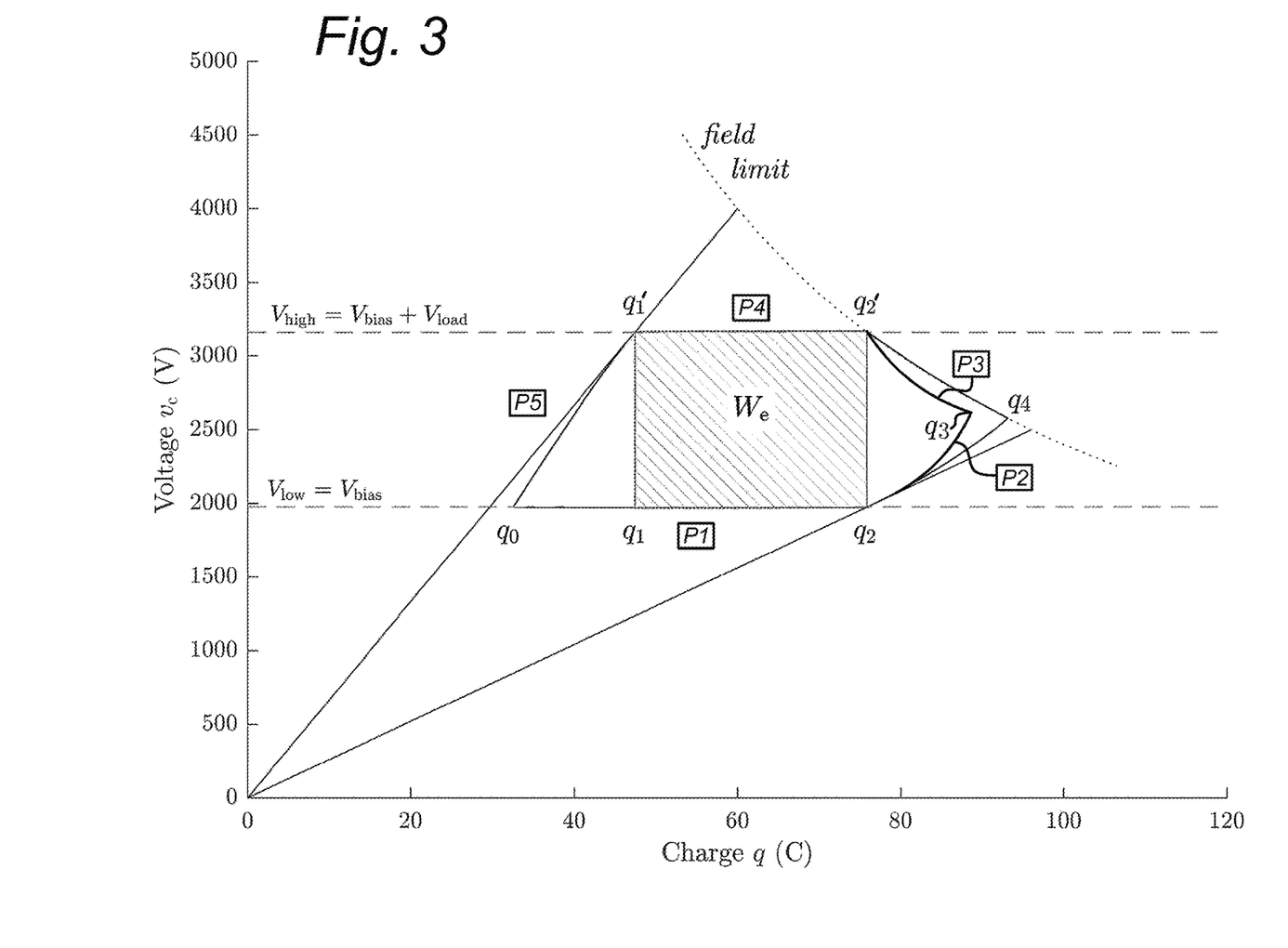
FIG. 3 shows a charge-voltage diagram of a variable capacitor relating to the charging and discharging states shown in FIG. 2A-2D.

FIG. 3 shows a charge-voltage q,V diagram of a variable capacitor Cs relating to the charging and discharging states shown in FIG. 2A-2D.

With reference to FIG. 3, a method for operating the energy harvesting system 100 as described above will be explained.

In FIG. 3 an exemplary charge-voltage q,V diagram is shown for a variable capacitor Cs. It will be appreciated that the value ranges that are shown are only indicative. The invention is not limited to a circuitry and/or a method operating within the ranges shown in FIG. 3, but may operate in different ranges of voltage and charge and with either positive or negative polarity for both voltage and charge.

Operating variable capacitors Cs in generator mode involves the application of charge (charging) at a state of maximum capacitance and subsequent removal of charge (discharging) at a state of minimum capacitance. The challenge of electrostatic energy conversion is the cyclic displacement of charge, the amount of energy involved therein is often several times higher than the amount of mechanical energy to be converted.

According to the invention, the displacement of charge within the energy harvesting system 100 is fully controllable. In contrast, with prior art passive energy harvesting circuits, the charge displacement is driven only indirectly by the imposed capacitance variation and its rate of change.

According to the invention, the method co-operates the passive (diodes D1, D2) and active (switches S1, S2) elements in the topology of the energy harvesting system 100 during the harvesting cycle: charge is displaced passively as much as possible using deformation-induced (passive) voltage-clamping to the voltages $V_{low}$, $V_{high}$ as if it was a passive harvesting cycle, while additional charges are displaced actively by charging/discharging as in active harvesting cycle portions such as constant-charge, constant-voltage and constant-field.

In an embodiment of the method, the active harvesting cycle portion involves a constant-field cycle i.e., the electric field is kept constant under a variation of the gap between the electrodes of the variable capacitor. The resulting hybrid harvesting cycle then constitutes a combined constant-voltage (indicated in FIG. 3 as stages P1 and P4) and constant-field (indicated as stage P3) cycle. It is identified that such cycle yields maximum energy within the limits of the voltage rating of the deployed active components (switches S1, S2 and diodes D1, D2).

An embodiment of an energy harvesting cycle with active constant-field cycle is illustrated in the q,V diagram of FIG. 3.

It comprises the following intervals:

At the start of a cycle, which is in this example defined at essentially minimum capacitance, and while capacitance is increasing, the variable capacitor Cs is charging from $q_0$ to $q_2$ at voltage $V_{low}$. The skilled in the art will appreciate that the starting point is taken arbitrarily: the cycle could start at a different value of the capacitance between the minimum and maximum capacitance values.

All charge from charge $q_0$ to charge $q_2$ is displaced entirely in passive mode using the second diode D2 along current path W1 while both the first and second switches S1, S2 are set in non-conductive state and the variable capacitor Cs is clamped to voltage $V_{low}$. See FIG. 2A. It is noted that during this stage the capacitance is increasing due to an external mechanical force which is larger than the electrostatic (Maxwell) force induced by the charges, causing a reduction of the gap G between the electrodes E1, E2 of the variable capacitor Cs.

Once the variable capacitor Cs is around maximum capacitance and no longer clamped to $V_{low}$ (for example observed by detecting a reduction of the current through the capacitor to essentially zero value: $i_{cap}$=0), the first switch S1 (step-down switch) is set to the modulated conductive state. Next in stage P2, the first switch S1 and second diode D2 actively allow the charging process along current paths W3 and W1 to continue to charge $q_3$ larger than $q_2$. For example, this interval lasts between 1% to 15% of the cycle period, where the former captures more energy from the variable capacitor, and the latter generates lower losses.

Optionally in stage P2, the variable capacitor Cs is charged to maximal charge $q_4$ which approaches or is located at the maximum electric field boundary. In FIG. 3, the maximum electric field boundary relation between charge q and voltage V is indicated by the dotted curve referenced as "field limit".

Subsequently, in stage P3, the charging and discharging cycle follows a q,V path during which the variable capacitor is gradually and actively discharged from $q_3$ (or $q_4$) to $q_{2'}$ using the second switch S2 in the modulated conductive state and the first diode D1. (The first switch S1 is set to the non-conductive state during P3.) Charge $q_{2'}$ may be equal to charge $q_2$. In case during stage P2 maximal charge $q_4$ was reached the q·V path follows a constant field q,V relationship.

When discharging from $q_4$ to $q_{2'}$, the second switch S2 and the first diode D1 are configured in a manner that the circuitry of the energy harvesting system 100 operates at the maximum electric field with $q \cdot V = \varepsilon \cdot Z \cdot E^2$, with q: charge, V: voltage, $\varepsilon$: permittivity, Z: volume and E: maximum electric field.

Once the variable capacitor voltage $v_{cap}$ has increased to voltage $V_{high}$ (at $q_{2'}$), during stage P4 the variable capacitor Cs is passively discharged from charge $q_{2'}$ to charge $q_{1'}$ along current path W2 using the first diode (clamping diode) D1 while both first and second switches S1, S2 are set in non-conductive state.

At around minimum capacitance, when the variable capacitor is no longer clamped to $V_{high}$ (detected by e.g. a zero value of the capacitor current $i_{cap}$=0), during stage P5 the variable capacitor is actively discharged from charge $q_{1'}$ to charge $q_0$ with current flow through the second switch S2 set in modulated conductive state and the first diode D1 along current paths W4 and W2. The duration of the latter interval is typically in the same order of duration as in stage P2, such that the charging and discharging current are of largely similar magnitude. The active discharging terminates when the voltage of the variable capacitor has substantially reached $V_{low}$ at $q_0$.

From FIG. 3 it can be observed that in comparison to the work performed in a passive cycle, indicated by rectangle We, the work in a combined passive and active cycle P1 . . . P5 is relatively larger with larger energy yield.

Accordingly, the invention relates to a method for operating an energy harvesting system 100 for harvesting electrical energy from at least one variable capacitor Cs, as described above, in which the variable capacitor that may comprise electrode layers separated by a deformable dielectric layer, is exposed to a cycle of mechanical loading and unloading, with a capacitance of the variable capacitor varying between a maximum capacitance at a minimal thickness of the dielectric layer during mechanical loading and a minimum capacitance during mechanical unloading. The method comprises:

electrically discharging the at least one variable capacitor over the first diode during mechanical unloading in a discharging time interval while first and second switches are set in non-conductive state, electrically charging the variable capacitor over the second diode during mechanical loading in a charging time interval while first and second switches are set in non-conductive state. Additionally, the method comprises:

setting the second switch in an modulated conductive state during a portion of the discharging time interval while the first switch remains in the non-conductive state, and setting the first switch in an modulated conductive state during a portion of the charging time interval, while the second switch remains in the non-conductive state.

In an embodiment, the method further comprises during the charging time interval:

clamping the at least one variable capacitor to the second voltage source V2 at $V_{low}$ with the first and second switches S1, S2 in an non-conductive state until the maximum capacitance at charge $q_2$ (in passive mode) is reached, and subsequently clamping the at least one variable capacitor to the first voltage source V1 at $V_{high}$ by said setting the first switch S1 in the modulated conductive state until a charge of the at least one variable capacitor reaches a charge $q_3$ larger than charge $q_2$ obtained in passive mode or optionally reaches a charge $q_4$ which approaches or is located at a maximum electric field boundary value.

In an embodiment, the method further comprises during the discharging time interval: after reaching $q_3$ (or $q_4$), setting the first switch in the non-conductive state and setting or holding the second switch in the modulated conductive state, for allowing discharging of the at least one variable capacitor until the voltage of the at least one variable capacitor reaches the value of the voltage $V_{high}$; subsequently, when the voltage of the at least one variable capacitor has reached the value of the voltage $V_{high}$, setting the second switch in the non-conductive state and setting or holding the first switch in the non-conductive state, for allowing further discharging of the at least one variable capacitor until the minimum capacitance is reached at charge $q_{1'}$ and voltage $V_{high}$.

Next, an active discharge from $q_{1'}$ to $q_0$ and from voltage $V_{high}$ to $V_{low}$ is done by activated switch SW2 until an essentially minimum capacitance is reached at charge $q_0$ and voltage $V_{low}$.

FIG. 4A-4E show a deformation, an electric field, a voltage, a charge and a current respectively of a variable capacitor coupled to the circuitry of FIG. 1.

Figure 4A:
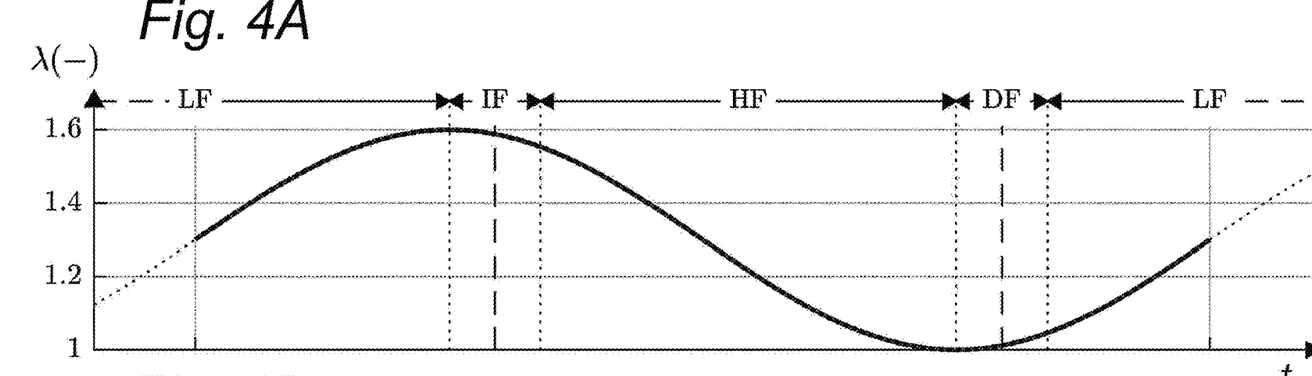
FIG. 4A-4E show a deformation, an electric field, a voltage, a charge and a current respectively of a variable capacitor coupled to the circuitry of FIG. 1.
Figure 4B:
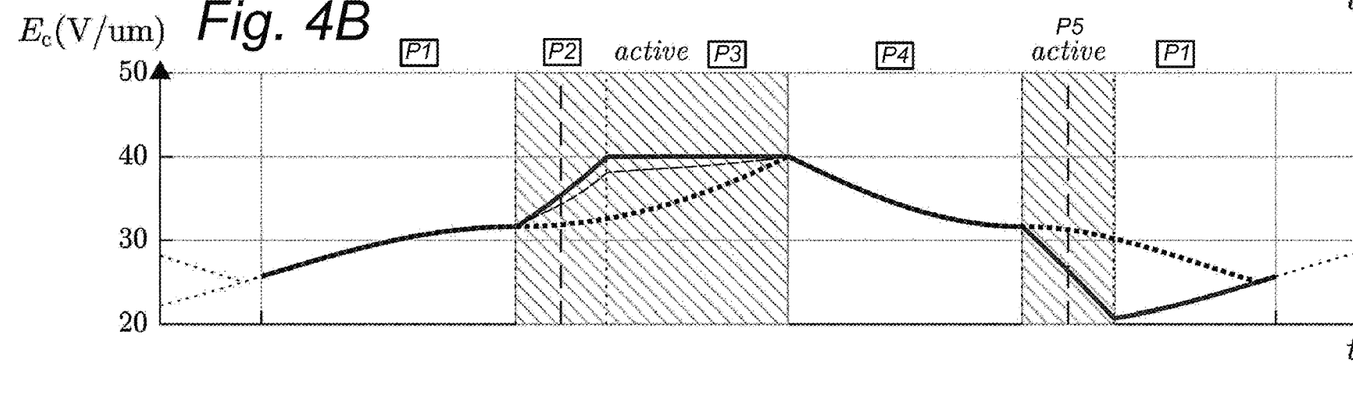
Figure 4C:
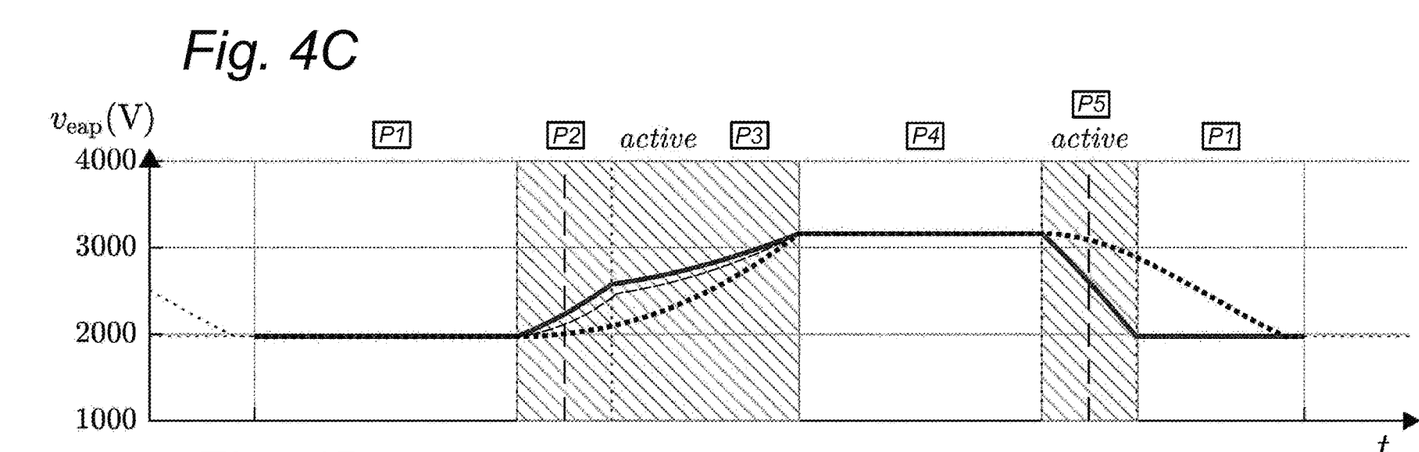
Figure 4D:
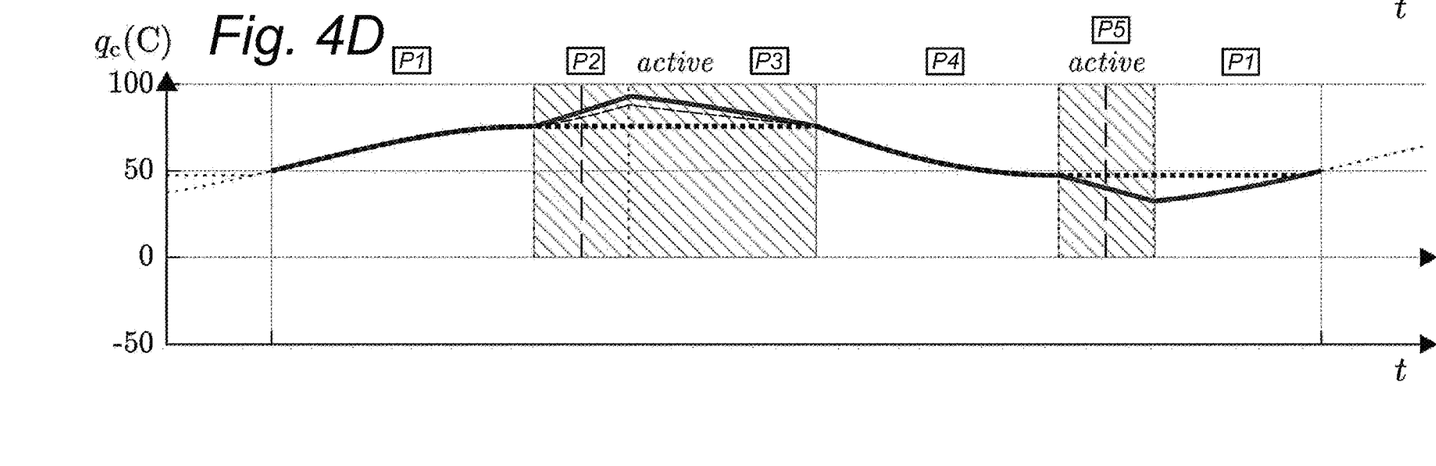
Figure 4E:
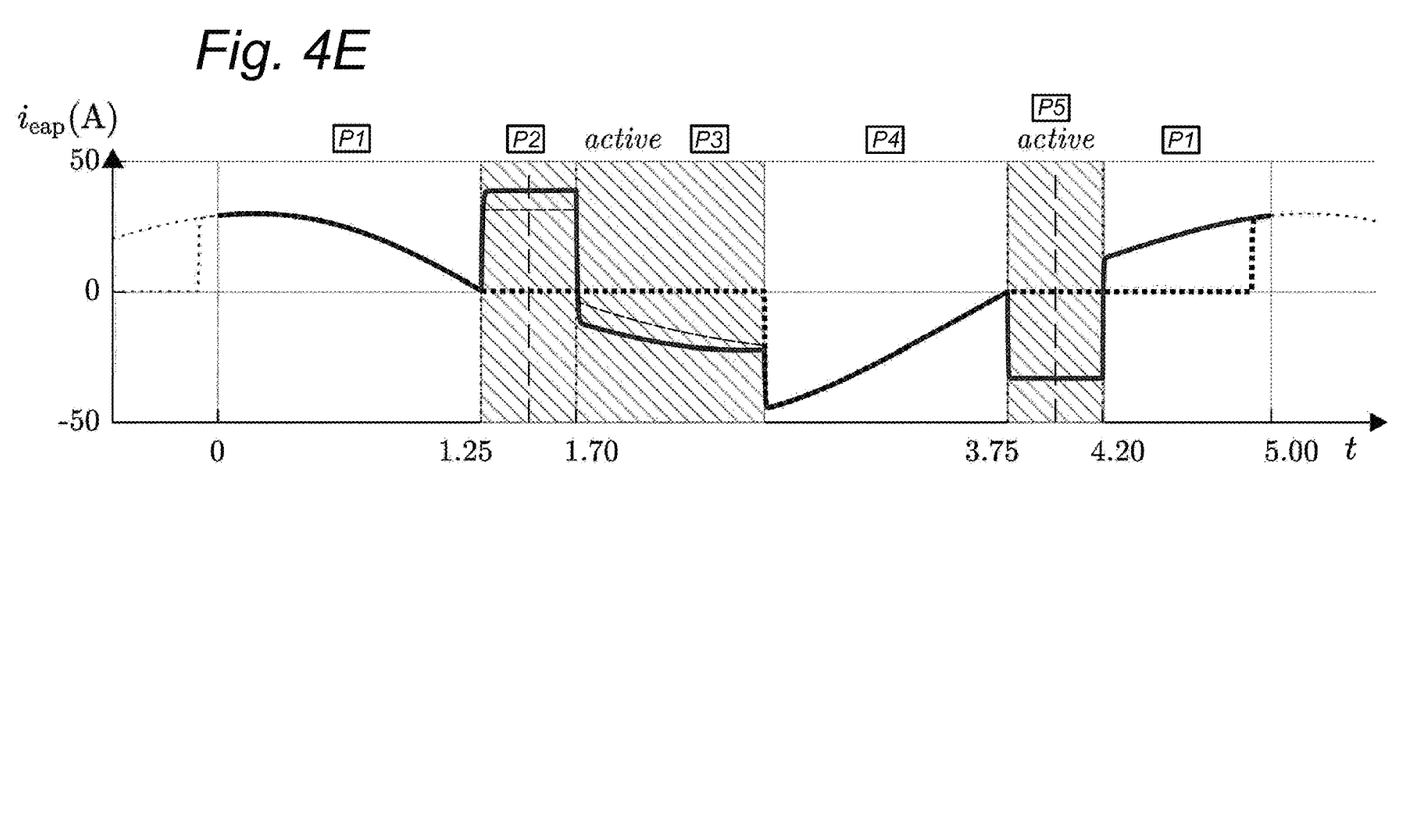

In FIG. 4A, a deformation cycle indicated by stretch parameter λ (stretching and relaxing) of an electro-active polymer based variable capacitor is shown as a function of time. For the same λ cycle, the variation of the electric field $E_c$ is shown in FIG. 4B, the variation of the voltage $v_{cap}$ on the variable capacitor is shown in FIG. 4C, the variation of the charge $q_c$ on the variable capacitor is shown in FIG. 4D and the variation of the variable capacitor's current $i_{cap}$ is shown in FIG. 4E, respectively. Also, the stages P1, P2, P3, P4 and P5 as described above with reference to FIG. 3, are indicated in each of FIGS. 4A-4E.

In FIG. 4A, the elastic stretch parameter λ is defined as the ratio of the strained length and the relaxed (i.e., not strained) length of the electro-active polymer based variable capacitor.

In each of FIG. 4B-4C, the variations originated in accordance with the energy harvesting system and method of the invention are represented by a solid line for the condition that charging of the variable capacitor takes place until the maximum electric field boundary is reached at $q_4$. The dashed line in each of FIGS. 4B-4E represent the variations in a harvesting cycle according to a method of the invention, where charging is done actively to a charge $q_3$, in which $|q_2|<|q_3|<|q_4|$. Discharging is done from charge $q_{1'}$ to charge $q_0$, with $|q_0|<|q_1|$. See FIG. 3.

The dotted line in each of FIGS. 4B-4E represent the variations in a passive-only harvesting cycle using only passive clamping diodes D1, D2. The stages P2, P3 and P5 in which either first switch S1 or second switch S2 are activated to the modulated conductive state are indicated by the hatched areas; the remaining intervals of the cycle are realized while both first and second switches S1, S2 are in the non-conductive state.

As can be seen, the use of active harvesting in the energy harvesting system results in a higher electrical field, higher capacitor voltage, and larger charge in comparison with passive harvesting.

Figure 5:
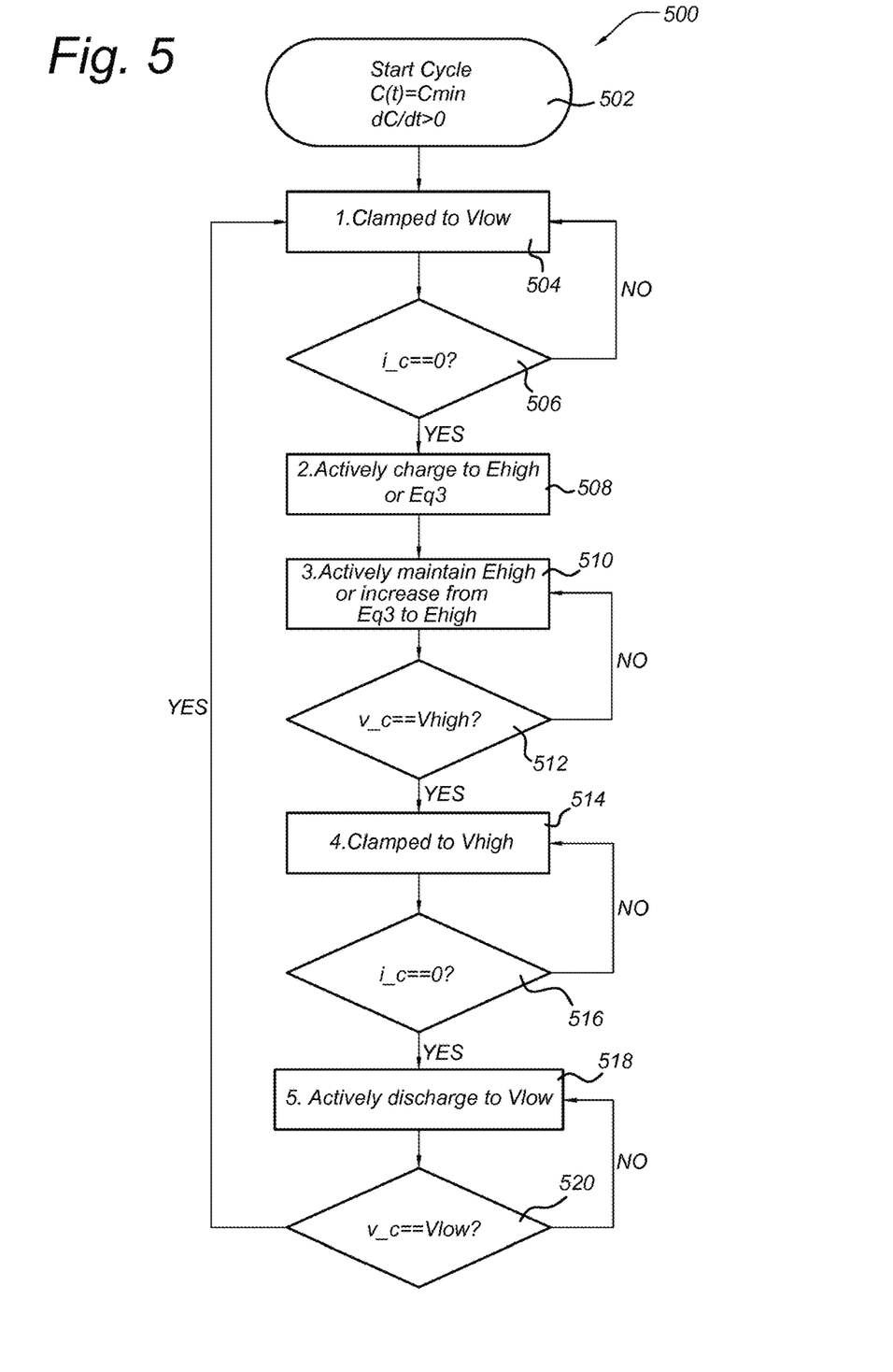
FIG. 5 shows a flow diagram for a method of operation of the energy harvesting system according to an embodiment of the invention.

FIG. 5 shows a flow diagram 500 for a method of operation of the energy harvesting system according to an embodiment of the invention.

To illustrate the method as described above with reference to FIGS. 2A-4E, a flow diagram is shown for use with the controller CT that is coupled with the energy harvesting system, as illustrated with reference to FIG. 1.

The controller CT is arranged to control an energy harvesting cycle of the energy harvesting system in accordance with steps in a procedure 500 as shown in the flow diagram. In an embodiment, the controller comprises at least a processor which is coupled to a memory. The memory is arranged to store instructions for the processor to carry out a control program in accordance with the procedure. In an alternative embodiment, the controller could be implemented as a state machine.

At step 502, the energy harvesting cycle starts at an arbitrary capacitance C(t) e.g., equal to or near minimum capacitance $C_{min}$, while the capacitance is increasing (dC/dt>0), i.e., while the gap G between the electrodes E1, E2 of the variable capacitor Cs is decreasing e.g., due to an external mechanical force.

If the controller CT detects that this condition is fulfilled, the energy harvesting system 100 is in stage P1 and the variable capacitor Cs clamped to $V_{low}$ with both the first and second switches S1, S2 in non-conductive state in step 504. In this manner, the variable capacitor is charged by current flowing through the second diode D2.

During clamping to $V_{low}$, in step 506 the controller CT monitors by means of the current sensor Sc if the current $i_{cap}$ through the variable capacitor becomes essentially zero (i.e., and taking into account possible systematic current leakage). If the current $i_{cap}$ is not zero, the energy harvesting system remains in stage P1 with the variable capacitor clamped to $V_{low}$. However if the current $i_{cap}$ becomes zero, in step 508 the controller CT activates the first switch S1 to modulated conductive state to allow the variable capacitor to charge to maximal electrical field $E_{high}$ at $q_4$ or an intermediate electrical field $E_{q3}$ at $q_3$. During charging to $q_4$ or to $q_3$, the energy harvesting system is in stage P2.

If the controller detects that the maximum electric field $E_{high}$ at $q_4$ (or $E_{q3}$ if $q_3$) is reached or approached, the controller CT enters step 510 and maintains the electric field at (or close to) maximum electric field $E_{high}$ (or during this step $E_{q3}$ increases to Ehigh) until the controller CT detects by means of sensor Sv in step 512 that the voltage $v_{cap}$ on the variable capacitor equals the high voltage level $V_{high}$. The energy harvesting system is now in stage P3. In step 510, the controller CT returns the first switch S1 to the open non-conductive state. In stage P3, the controller CT activates the second switch S2 to allow the variable capacitor to discharge in order to keep the electric field constant.

If the voltage $v_{cap}$ on the variable capacitor is smaller than $V_{high}$ then the procedure returns to step 510. If the controller detects by sensor Sv that the voltage $v_{cap}$ on the variable capacitor is equal to $V_{high}$, then the procedure continues in step 514.

In step 514, the controller CT returns the second switch S2 to the non-conductive state which causes the variable capacitor to discharge over the first diode D1, while both first and second switches S1, S2 are in non-conductive state. In step 514, the energy harvesting system is in stage P4.

In step 516, the controller CT monitors by means of the current sensor Sc if the current $i_{cap}$ through the variable capacitor Cs becomes essentially zero to detect an end of the discharging step 514. If the current $i_{cap}$ through the variable capacitor Cs becomes zero, in step 518 the detector activates the second switch S2 to the modulated conductive state to discharge further until the voltage on the variable capacitor reaches $V_{low}$. In step 518, the energy harvesting system is in stage P5.

Finally in step 520, the controller checks if the voltage $v_{cap}$ over the variable capacitor has reached $V_{low}$ by means of the voltage sensor Sv. If the voltage $v_{cap}$ over the variable capacitor has reached $V_{low}$, then the procedure returns to step 504 (stage P1), otherwise step 518 is continued.

To control the cycling of the energy harvesting system, the controller is configured to derive or measure the intensity of the electric field across the variable capacitor, assuming that the state of maximum and minimum capacitance is observed using zero current detection, $i_{cap}=0$. Further, this requires measuring the voltage $v_{cap}$ and a distance of the gap between the electrodes. The gap distance can be measured mechanically/physically or derived from an electrical capacitance measurement.

The invention has been described with reference to some embodiments. Obvious modifications and alterations will occur to others upon reading and understanding the preceding detailed description. It is intended that the invention be construed as including all such modifications and alterations insofar as they come within the scope of the appended claims.

In particular, combinations of specific features of various aspects of the invention may be made. An aspect of the invention may be further advantageously enhanced by adding a feature that was described in relation to another aspect of the invention.

In this document and in its claims, the verb "to comprise" and its conjugations are used in their non-limiting sense to mean that items following the word are included, without excluding items not specifically mentioned. In addition, reference to an element by the indefinite article "a" or "an" does not exclude the possibility that more than one of the element is present, unless the context clearly requires that there be one and only one of the elements. The indefinite article "a" or "an" thus usually means "at least one".

The invention claimed is:

1. An energy harvesting system (100) for harvesting electrical energy from at least one variable capacitor (Cs), comprising the at least one variable capacitor, a first voltage source (V1) for providing a first voltage ($V_{load}$) and a second voltage source (V2) for providing a second voltage ($V_{bias}$), for each variable capacitor a respective half-bridge network (H1);

the first and second voltage sources (V1, V2) arranged in a series connection with an interconnecting node (N1) between a terminal (T11) of first polarity of the first voltage source and a terminal (T22) of second polarity of the second voltage source, the second polarity being opposite to the first polarity;

the respective half-bridge network comprising a pair of a first diode (D1) and second diode (D2) connected in series with common node (N2) between the first and second diodes, the pair being connected parallel to the first voltage source between the terminal (T11) of first polarity and a terminal (T12) of second polarity of the first voltage source;

the at least one variable capacitor being connected with a first capacitor terminal (TC1) to the common node (N2) and with a second capacitor terminal (TC2) to a terminal (T21) of first polarity of the second voltage source (V2);

wherein for each variable capacitor the system further comprises an inductor (L1), a first switch (S1) and a second switch (S2);

the inductor (L1) is connected between the common node (N2) and the first capacitor terminal (TC1) of the respective variable capacitor, and the first switch (S1) is connected in parallel with the first diode (D1) and the second switch (S2) is connected in parallel with the second diode (D2).

2. The energy harvesting system according to claim 1 wherein the at least one variable capacitor is an electro-active polymer device comprising a first electrode layer, a second electrode layer and a dielectric elastomer layer, in which the dielectric elastomer layer is arranged between the first and second electrode layers.

3. The energy harvesting system according to claim 1, further comprising a controller (CT); the controller being connected to the first and second switches (S1, S2) in the half-bridge network (H1) for controlling a switch state for each of the switches.

4. The energy harvesting system according to claim 1 wherein each of the first and second switches comprise a driver element for actively switching on and off the respective switch at a predetermined switching rate.

5. The energy harvesting system according to claim 3, wherein the controller comprises for each variable capacitor a modulator device (M) for providing a modulating signal to one or more of the switches.

6. The energy harvesting system according to claim 5, wherein the controller comprises a voltage sensor (Sv) for measuring a voltage $v_{cap}$ over the at least one variable capacitor, and a current sensor (Sc) for measuring a current $i_{cap}$ through the variable capacitor.

7. The energy harvesting system according to claim 3, wherein the controller is configured to regulate an output voltage by means of a loop control based on a voltage measured on the variable capacitor.

8. The energy harvesting system according to claim 5, further comprising at least a second variable capacitor (CS2), wherein the at least second variable capacitor is connected with a first capacitor terminal (TC1-2) thereof to the common node (N22) and with a second capacitor terminal (TC2-2) thereof to the terminal (T21) of first polarity of the second voltage source (V2), and for each variable capacitor the controller is configured with clock signal generator (CG) for providing a respective modulator device (M) that is arranged for modulating at least one of the first and second switches, with a common clock signal for synchronous operation of the energy harvesting system for the at least one and second variable capacitors; the modulator device of each of the at least first and second variable capacitors configured to have a respective phase relative to the common clock signal.

9. The energy harvesting system according to claim 1, wherein either a ground terminal (GND) is provided at the interconnecting node (N1) between the first and second voltage sources or a ground terminal (GND) is provided at the second terminal (T21) of the second voltage source (V1).

10. The energy harvesting system according to claim 1 wherein the first voltage source comprised at least a resistor, and wherein the first voltage source is configured to generate a first voltage as a function of charge displacement that is imposed by the at least one variable capacitor through the associated half-bridge network.

11. A method for operating an energy harvesting system (100) for harvesting electrical energy from at least one variable capacitor (Cs; Cs2) with a capacitance being variable as a function of mechanical deformation, in accordance with claim 1,
in which the at least one variable capacitor is exposed to a cycle (λ) of mechanical loading and unloading, with the capacitance of the variable capacitor varying between a maximum capacitance during maximum mechanical loading and a minimum capacitance during minimum mechanical loading, the method comprising:
electrically discharging the at least one variable capacitor during mechanical unloading in a discharging time interval (P4) over the first diode while first and second switches are in non-conductive state,
electrically charging the at least one variable capacitor during mechanically loading in a charging time interval (P1) over the second diode while first and second switches are in non-conductive state, and
wherein the method comprises:
setting the second switch in a modulated conductive state during a portion of the discharging time interval (P3; P5) while the first switch remains in, or is set to, the non-conductive state, and
setting the first switch in an modulated conductive state during a portion of the charging time interval (P2), while the second switch remains in, or is set to, the non-conductive state.

12. The method according to claim 11, comprising during the charging time interval:
clamping (P1) the second voltage source (V2) at the second voltage ($V_{bias}$) to the at least one variable capacitor with the first and second switches (S1, S2) in an non-conductive state until the maximum capacitance and a first charge $q_2$ is reached, and subsequently
clamping (P2) the first voltage source (V1) at the first voltage ($V_{load}$) to the at least one variable capacitor in series with the second voltage source (V2) at the second voltage ($V_{bias}$) by setting the first switch (S1) in the modulated conductive state until a second charge $q_3$ of the at least one variable capacitor is reached with $q_3>q_2$ or a third charge $q_4$ is reached to or is approaching a maximum electric field boundary value, with $q_4>q_3>q_2$.

13. The method according to claim 11, comprising during the discharging time interval:
after reaching the second charge value $q_3$ or third charge value $q_4$: setting the first switch in the non-conductive state and holding the second switch in the modulated conductive state, for allowing discharging of the at least one variable capacitor, until the voltage of the at least one variable capacitor reaches the value of the sum of the first voltage and second voltage $V_{bias}+V_{load}$ (P3);
subsequently, when the voltage of the at least one variable capacitor has reached the value of $V_{bias}+V_{load}$: setting the second switch in the non-conductive state and leaving the first switch in the non-conductive state, for allowing further discharging of the at least one variable capacitor, until a fourth charge $q_1$ is reached (P4) at the $V_{bias}+V_{load}$ value, and
subsequently, setting the second switch in the modulated conductive state, for allowing additional discharging of the at least one variable capacitor from the fourth charge $_{q1}$, to a fifth charge $q_0$ at the value of the second voltage ($V_{bias}$), the fifth charge value $q_0$ being smaller than any of $q_1$, $q_2$, $q_3$.

14. The method according to claim 11, wherein to control the cycling of the energy harvesting system, the method comprises:
deriving or measuring an intensity of an electric field across the variable capacitor, assuming that a state of maximum and minimum capacitance is observed using zero current detection, with a current through the capacitor $i_{cap}=0$,
further including measuring the capacitor voltage $v_{cap}$ and either measuring a distance of the gap between electrodes of the capacitor, or deriving the distance of the gap from a capacitance determined from measured capacitor voltage $v_{cap}$ and measured capacitor current $i_{cap}$.

15. The method according to claim 14, wherein the maximum capacitance or minimum capacitance is determined by measuring a zero-crossing of the current through the capacitor.

16. The energy harvesting system according to claim 3, wherein the controller comprises a voltage sensor (Sv) for measuring a voltage $v_{cap}$ over the at least one variable capacitor, and a current sensor (Sc) for measuring a current $i_{cap}$ through the variable capacitor.

17. The energy harvesting system according to claim 2, further comprising a controller (CT); the controller being connected to the first and second switches (S1, S2) in the half-bridge network (H1) for controlling a switch state for each of the switches.

18. The energy harvesting system according to claim 1 wherein each of the first and second switches comprise a driver element for actively switching on and off the respective switch at a predetermined switching rate, the switching rate being dynamically adjusted based on a measured voltage on the variable capacitor and/or on a measured charging or discharging current.

19. The energy harvesting system according to claim 4, wherein the controller is configured to regulate an output voltage by means of a loop control based on a voltage measured on the variable capacitor.

20. The energy harvesting system according to claim 5, wherein the controller is configured to regulate an output voltage by means of a loop control based on a voltage measured on the variable capacitor.

* * * * *